(12) United States Patent
Kosaka

(10) Patent No.: US 6,574,209 B1
(45) Date of Patent: Jun. 3, 2003

(54) RADIO COMMUNICATION DEVICE HAVING VARIABLE COMMUNICATION SPEED

(75) Inventor: Akio Kosaka, Chiryu (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/375,247

(22) Filed: Aug. 16, 1999

(30) Foreign Application Priority Data

Sep. 7, 1998 (JP) .......................................... 10-252754

(51) Int. Cl.[7] .............................................. H04B 7/216
(52) U.S. Cl. ...................... 370/342; 455/67.1; 455/115
(58) Field of Search ............................. 455/67.1, 67.4, 455/115, 117, 553, 556, 69, 423, 425; 370/320, 342, 441, 335; 340/635

(56) References Cited

U.S. PATENT DOCUMENTS

| | | | |
|---|---|---|---|
| 5,070,536 A | * 12/1991 | Mahany et al. | ............ 455/67.4 |
| 5,081,713 A | * 1/1992 | Miyazaki | .................... 455/115 |
| 5,519,886 A | * 5/1996 | Gilbert et al. | .............. 455/115 |
| 6,087,949 A | * 7/2000 | Yanagida | .................... 340/635 |

FOREIGN PATENT DOCUMENTS

JP    A-9-326749    12/1997

\* cited by examiner

*Primary Examiner*—Quochien Vuong
(74) *Attorney, Agent, or Firm*—Harness, Dickey & Pierce, PLC

(57) ABSTRACT

Communication speed of a radio communication device such as a portable telephone is controlled according to temperature of a transmitting amplifier to avoid overheating of the device. The transmitting amplifier temperature is detected by a temperature detector installed in the device. When the transmitting amplifier temperature is lower than a first temperature, the communication speed is set at a high level to transmit both voice and image data. When the transmitting amplifier temperature exceeds the first temperature, the communication speed is automatically switched to a low level to avoid overheating of the device. Under the low speed communication, only the voice data are transmitted. When the transmitting amplifier temperature becomes below a second temperature that is lower than the first temperature, the communication speed is switched back to the high level to resume transmission of both voice and image data. Thus, the communication device is protected from overheating without interrupting communication.

4 Claims, 3 Drawing Sheets

RADIO COMMUNICATION DEVICE HAVING VARIABLE COMMUNICATION SPEED

CROSS-REFERENCE TO RELATED APPLICATION

This application is based upon and claims benefit of priority of Japanese Patent Application No. Hei-10-252754 filed on Sep. 7, 1998, the content of which is incorporated herein by reference.

BACKGROUND OF THE INVENTION

1. Field of the Invention

The present invention relates to a radio communication device such as a portable telephone that operates under the code-division multiple access system (CDMA), and more particularly to such a device, the communication speed of which is controlled according to temperature of its transmitting amplifier.

2. Description of Related Art

Digital radio communication devices that operate under the time-division multiple access (TDMA) system or under the code-division multiple access (CDMA) are widely used. In high speed communication using a portable packet communication device that operates under the TDMA system, data transmission is performed by continuous time slots. However, if the data transmission is continuously performed, temperature of the transmitting amplifier tends to rise excessively due to high power consumed in the high speed continuous transmission. In case the amplifier temperature exceeds a permissible level, components such as power transistors constituting the amplifier may be damaged by the excessive heat.

To cope with this problem, JP-A-9-326749 proposes a device that operates in the following manner. The device disclosed therein is a portable device for packet communication operating under the TDMA system. In this device, whether TDMA radio time slots are used continuously or intermittently is determined, based on the transmitting amplifier temperature detected by a sensor or information of the TDMA radio time slots used in transmission. Since continuous or intermittent transmission is selectively switched based on the transmitting amplifier temperature, the temperature rise in the device is limited to a certain level even if the data transmission is performed for a long period of time. In this manner, the components of the device such as power transistors are protected from being damaged by excessive heat.

Under the CDMA system, as in the TDMA, a higher transmitting power is consumed as the communication speed increases, as shown in the graph of FIG. 4. Accordingly, the transmitting amplifier temperature becomes higher according to the transmitting speed. If high speed transmission is performed continuously for a long period of time, there is a possibility that the device be damaged due to excessive heat generated in the transmitting amplifier. Under the TDMA, if there is a period in which no transmission is performed by using the radio time slots intermittently, it does not give inconvenience to a user, because the data transmitted are packet data. On the contrary, since the data transmitted under the CDMA are real time data, communication between users are hindered if there is a period in which no data transmission is performed.

SUMMARY OF THE INVENTION

The present invention has been made in view of the above-mentioned problem, and an object of the present invention is to provide a radio communication device, such as a portable telephone device, that is able to perform high speed communication, while avoiding excessive temperature rise in the device and discontinuation of communication between users.

A portable telephone device operating under the CDMA includes a receiver-transmitter that receives and transmits high frequency signals, a voice processor connected to a speaker and a microphone, an image processor connected to a display panel and a camera, a key pad for inputting command signals, and a controller that controls the operation of the whole device. Generally, high transmitting power is consumed, and temperature of a transmitting amplifier becomes high, when communication is performed at a high speed. A temperature detector for detecting the transmitting amplifier is disposed in the receiver-transmitter.

When the transmitting amplifier temperature is lower than a predetermined first temperature, communication speed of the device is set at a high speed, e.g., 64 kbps. When the transmitting amplifier temperature exceeds the first temperature during operation at the high speed, the communication speed is automatically switched to a low speed, e.g., 8 kbps to avoid overheating of the device. After the transmitting amplifier temperature becomes below a predetermined second temperature that is lower than the first temperature during operation at the low speed, the communication speed is automatically switched again to the high speed.

Both of the voice and image data are transmitted during the period in which communication is performed at the high speed. When the communication speed is switched to the low speed to avoid overheating of the device, only the voice data are transmitted and transmission of the image data is cut off, because the low speed is insufficient to transmit both the voice and image data. When the communication speed is switched back again to the high speed, transmission of both the voice and image data are resumed.

According to the present invention, the communication device is protected from overheating while keeping the communication speed as high as possible without interrupting communication.

Other objects and features of the present invention will become more readily apparent from a better understanding of the preferred embodiment described below with reference to the following drawings.

DETAILED DESCRIPTION OF THE PREFERRED EMBODIMENT

Figure 4:
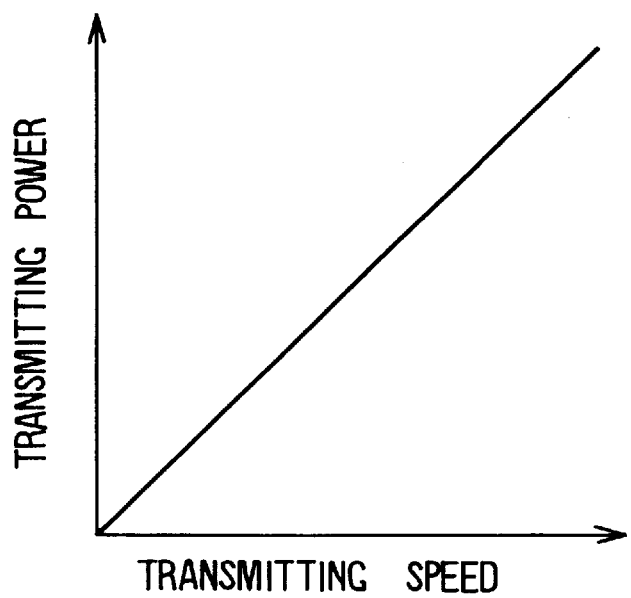
FIG. 4 is a graph showing transmitting power consumed in the device versus transmitting speed.

A preferred embodiment of the present invention will be described with reference to the accompanying drawings. The embodiment shown here is a portable telephone device for sending and receiving both voice and image data, and it operates under the CDMA using dispersed codes. Under the CDMA, a high communication speed can be realized by using a multi-code method. If three multi-codes are used, the communication speed can be increased by three times. However, as seen in the graph of FIG. 4, higher transmitting power is consumed, as the communication speed increases. Accordingly, the transmitting amplifier temperature becomes higher. According to the present invention, the communication speed is controlled according to the transmitting amplifier temperature to prevent excessive heating of the device.

Figure 2:
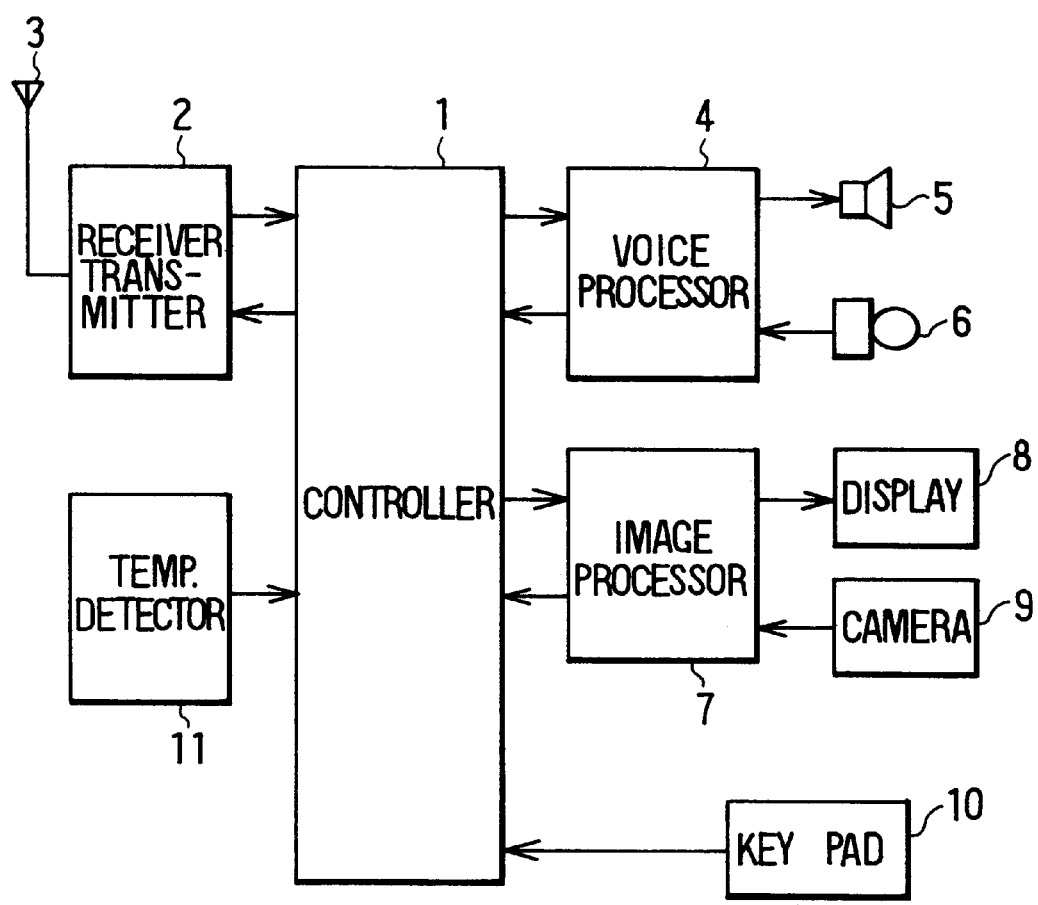
FIG. 2 is a block diagram showing a whole structure of a radio communication device.

First, referring to FIG. 2, a circuit structure of the communication device as the embodiment of the present invention will be described. A controller 1 for controlling the communication process in the device includes a microcomputer as its main component. The controller 1 is connected to a receiver-transmitter 2 that is connected to an antenna 3. Further, the controller 1 is connected to a voice processor 4 and an image processor 7. The voice processor 4 feeds its output to a speaker 5, and voice data are fed from a microphone 6 to the voice processor 4. The image processor 7 supplies its output to a display 8, and image data are fed from a camera 9 to the image processor 7. A key pad 10 is connected to the controller 1 to feed command signals thereto.

The key pad 10 includes various keys, such as a POWER key, a START key, an END key, NUMBER keys for numerals "0" to "9", an IMAGE key, for commanding various operation to the controller 1. Upon turning on the POWER key, the antenna 3 catches the strongest radio wave among others and sends it to the receiver-transmitter 2. The receiver-transmitter 2 converts the high frequency signals into receiving base band signals through an antenna coupler, a high frequency amplifier and a receiving mixer, and sends the receiving base band signals to the controller 1. The controller 1 demodulates the receiving base band signals into data signals. If the controller 1 determines that a position registration is necessary based on the data signals, converts position registration signals into transmitting base band signals and feeds them to the receiver-transmitter 2. The receiver-transmitter 2 converts the transmitting base band signals into transmitting high frequency signals through its transmitting mixer and transmits them as radio wave, through a transmitting power amplifier and the antenna coupler, from the antenna 3. After completion of the above processes, the portable telephone is brought to a waiting state.

To send a call, the telephone number to be called is inputted from the NUMBER keys. The controller 1 displays the inputted number on the display 8 through the image processor 7. After the displayed number is confirmed, the START key is pushed, and thereby the call is started. Upon starting of the call, user's voice is inputted from the microphone 6 and is fed to the voice processor 4. The voice processor 4 converts the voice signals into digital signals through its A/D converter, and then the digital signals are compressed into low-bit-rate transmitting voice data signals which in turn is fed to the controller 1. If radio wave conditions at that time is sufficiently good to perform high speed communication of 64 kbps, upon operation of the IMAGE key, video images of the user is taken in by the camera 9 and sent to the image processor 7 as electric signals. The image signals are converted into digital signals through an amplifier and an A/D converter in the image processor 7. Further, the digital image signals are compressed into low-bit-rate transmitting image data signals which are fed to the controller 1.

The voice data signals and the image data signals, both fed to the controller 1 are processed under the CDMA and digitally modulated into transmitting base band signals. The transmitting base band signals are fed to the receiver-transmitter 2 which converts the transmitting base band signals into transmitting high frequency signals. The transmitting high frequency signals are amplified and transmitted from the antenna 3 as radio wave to a relay terminal.

On the other hand, radio wave sent from the relay terminal and received by the antenna 3 is fed to the receiver-transmitter 2 as high frequency receiving signals. The receiver-transmitter 2 converts the high frequency receiving signals into receiving base band signals through its antenna coupler, high frequency amplifier and receiving mixer. The converted receiving base band signals are fed to the controller 1, in which the receiving base band signals are demodulated, processed under CDMA, and are fed to the voice processor 4 and to the image processor 7 as receiving voice data signals and image data signals, respectively. The receiving voice data signals fed to the voice processor 4 are stretched into receiving voice digital signals and then further converted into analog voice signals through the D/A converter. The analog voice signals are sent to the speaker 5 through the amplifier. The receiving image data sent to the image processor 7 are stretched into receiving image digital signals that are fed to the display 8.

To receive a call in the waiting state, a call message sent from a relay terminal is received by the antenna 3, and the call message is converted into a base band signal through the receiver-transmitter 2. The base band signal is processed in the controller 1 to initiate the call reception. After the call reception is completed, communication is performed in the same manner as described above for sending a call.

A temperature detector 11 having a thermistor is disposed at a vicinity of the transmitting power amplifier of the receiver-transmitter 2. The temperature detector 11 detects the temperature of the transmitting power amplifier and outputs an analog signal that is proportional to the amplifier temperature. The analog signal is converted into a digital signal through an A/D converter contained in the temperature detector 11, and the digital signal is fed to the controller 1. The controller 1 calculates the amplifier temperature based on the digital signal.

Figure 1:
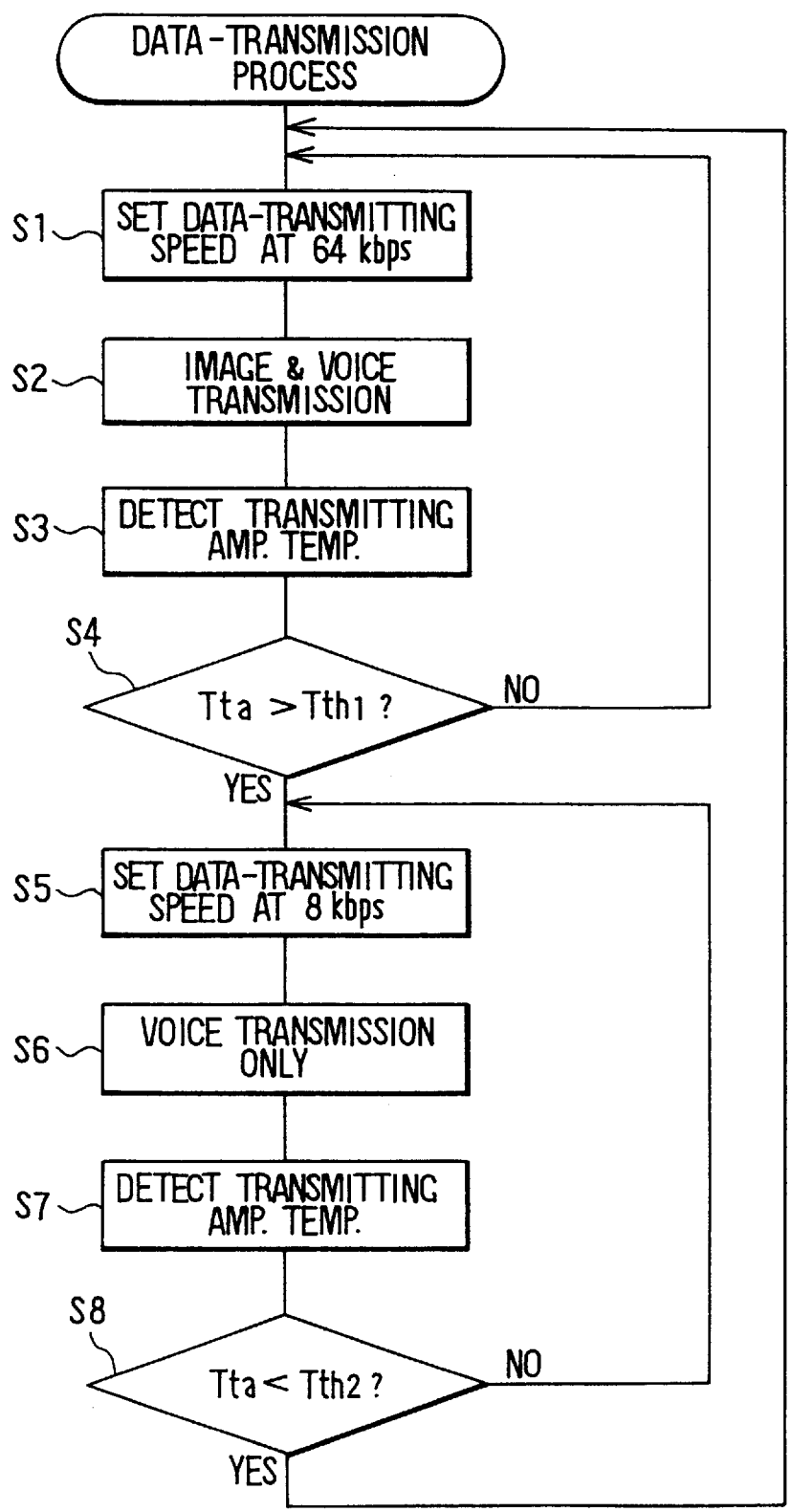
FIG. 1 is a flowchart showing a data transmission process according to the present invention.

Referring to FIG. 1, the process of sending a call will be described in detail. Upon inputting a telephone number to be called and pushing the START key, the controller 1 comes out of a main routine and moves to an interrupt-routine shown in FIG. 1. Thereafter, the controller 1 performs the process shown in the interrupt-routine. At step S1, the communication speed (data transmitting speed) is set at 64 kbps. At step S2, the portable telephone device is brought to a dual mode, in which both voice communication and image communication are performed. Namely, the voice of party A using this portable telephone is fed into the device through the microphone 6, and the video image of party A is fed into the device through the camera 9. The voice of the other party B is heard through the speaker 5, and the image of party B is shown on the display 8. At step S3, the transmitting amplifier temperature Tta is calculated based on the signal fed from the temperature detector 11 to the controller 1.

At step S4, it is determined whether the transmitting amplifier temperature Tta is higher than a predetermined first threshold temperature Tth1 (Tta>Tth1?). If Tta is not higher than Tth1, the program moves to step S1, and steps S1–S4 are repeated thereafter. If Tta is higher than Tth1, the program moves to the next step S5. At step S5, the communication speed is set at 8 kbps. At the next step S6, the device is brought to a voice mode in which only voice communication is performed. Namely, only the voice signals of both parties are processed. If the device is in the dual mode at that time, the dual mode is switched to the voice mode. In this case, one frame image of party B displayed at the last moment is stored in a memory of the image processor 7 and is continuously displayed as a still image. It is also possible for party A to turn off the display 8 to display nothing thereon. Power supply to the camera 9 is automatically turned off at the moment the mode is switched from the dual mode to the voice mode. Then, the program moves to step S7.

At step S7, the transmitting amplifier temperature Tta is detected again. At the next step S8, it is determined whether the transmitting amplifier temperature Tta is lower than a predetermined second threshold temperature Tth2 (Tta<Tth2?). The predetermined second threshold temperature Tth2 is preset at a level lower than the predetermined first threshold temperature Tth2. If Tta is not lower than Tth2, the program moves to step S5. Steps S5–S7 are repeated thereafter. If it is determined that Tta is lower than Tth2 at step S8, the program moves to step S1 where the communication speed is set at 64 kbps.

Figure 3:
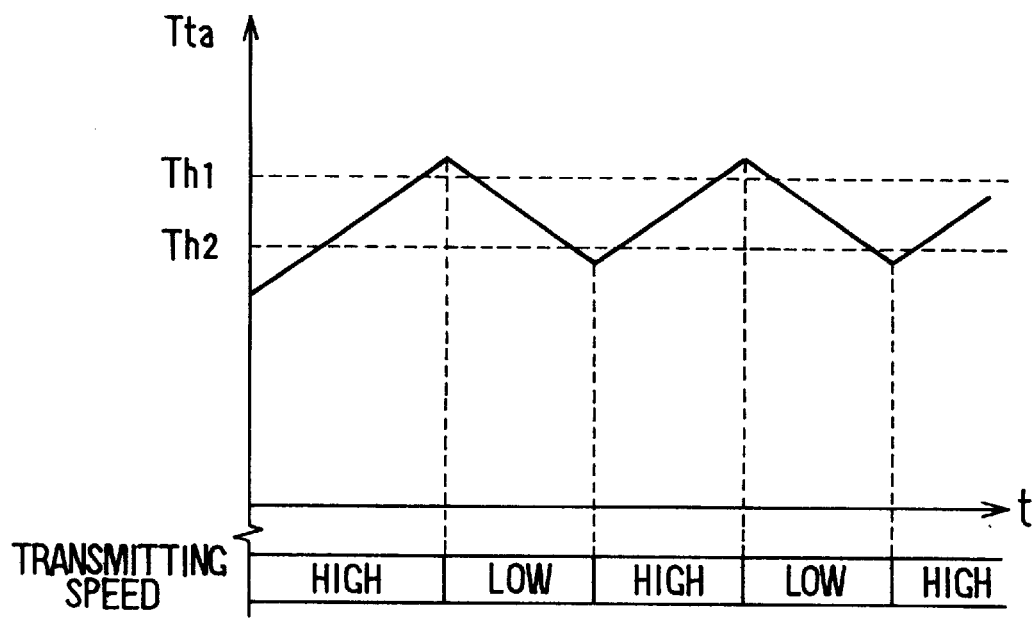
FIG. 3 is a graph showing temperature of a transmitting amplifier versus transmitting speed, the temperature being controlled by switching the transmitting speed.

Referring to FIG. 3, relation between the transmitting amplifier temperature Tta and the communication speed controlled under the program shown in FIG. 1 will be explained. During the period in which the communication is performed at a high speed of 64 kbps, the transmitting amplifier temperature Tta gradually rises. When Tth exceeds the level of the first threshold temperature Tth1, the communication speed is automatically switched to a low speed of 8 kbps. During the period in which the communication is performed at the low speed, Tth gradually decreases. When Tth becomes below the level of the second threshold temperature Tth2, the communication speed is automatically switched from the low speed to the high speed. Thereafter, the process described above is repeated as shown in FIG. 3.

The first threshold temperature Tth1 is preset at a level at which components constituting the transmitting amplifier such as transistors are not damaged by excessive heat. The second threshold temperature Tth2 is preset, at a level that is lower than the first threshold temperature Tth1 to provide a proper hysteresis in switching the communication speeds.

Advantages of the present invention are summarized as follows. Since the communication at a high speed which generates a high amount of heat in the device is automatically switched to the communication at a low speed, the transmitting amplifier is protected from being damaged or malfunctioning due to excessive heat. Since a hysteresis is provided in switching the communication speeds by setting two threshold temperature levels, Tth1 and Tth2, the high communication speed that is once switched to a lower speed when the transmitting amplifier temperature Tta exceeds Tth1 can be automatically recovered after the transmitting amplifier has been cooled down to the level of Tth2. Thus, the communication can be performed at a possible highest speed without damaging the device.

Since the dual mode being performed at the high communication speed (64 kbps) is automatically switched to the voice mode at the low communication speed (8 kbps) when the transmitting amplifier temperature Tta exceeds the threshold temperature, the voice communication can be continuously performed without interruption while avoiding an excessive temperature rise in the device. The high communication speed at 64 kbps is necessary for the dual mode (voice and image), while the low speed at 8 kbps is sufficient for the voice mode (voice only). When the dual mode is switched to the voice mode, party A who is sending messages to the other party B easily recognizes that the communication mode is switched to the voice mode because only a still image of party B is shown on the display 8. Party A may notify to party B by voice that image transmission is discontinued because of excessive heating of the device. If necessary, party A may tell party B to call him again after the dual mode communication is recovered. Further, when the transmitting amplifier temperature Tth drops below the level of the second threshold temperature Tth2 during a period in which the voice mode communication is being continued, the dual mode is automatically recovered, and thereby the image data transmission is automatically resumed.

The size of the display 8 may be variously selected. It may be a small panel installed on a part of the portable device, or a large panel covering a substantially whole surface of the portable device. Though the two levels of communication speed are switched according to the transmitting amplifier temperature in the embodiment described above, it is possible to set several levels of the communication speed. The present invention may be applied also to a portable telephone having no display panel, though the display 8 is installed on the embodiment described above.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A radio communication device operating under a code-division multiple access system and having a transmitting amplifier, the device comprising:

a temperature detector for detecting temperature of the transmitting amplifier;

means for controlling transmitting speed of the device based on the detected temperature of the transmitting amplifier; and wherein the transmitting speed is controlled to a predetermined first speed when the temperature of the transmitting amplifier is lower than a predetermined first temperature;

the transmitting speed is controlled to a predetermined second speed that is lower than the predetermined first speed when the temperature of the transmitting amplifier exceeds the predetermined first temperature; and the transmitting speed is controlled again to the predetermined first speed when the temperature of the transmitting amplifier becomes below a predetermined second temperature that is lower than the predetermined first temperature.

2. The radio communication device as in claim 1, wherein:

voice and image data are transmitted when the transmitting speed is controlled to the predetermined first speed; and only the voice data are transmitted when the transmitting speed is controlled to the predetermined second speed.

3. A radio communication device operating under a code-division multiple access system and having a transmitting amplifier, the device comprising:

a temperature detector for detecting temperature of the transmitting amplifier;

means for controlling transmitting speed of the device based on the detected temperature of the transmitting amplifier;

means for transmitting voice data and means for transmitting image data;

the means for controlling the transmitting speed controls the transmitting speed to a high level under which both the voice data and the image data are transmitted, when the temperature of the transmitting amplifier is lower than a predetermined temperature; and the means for controlling the transmitting speed controls the transmitting speed to a low level under which only the voice data are transmitted, when the temperature of the transmitting amplifier exceeds the predetermined temperature.

4. The radio communication device as in claim 3, wherein:

the means for controlling the transmitting speed controls the transmitting speed again to the high level, when the temperature of the transmitting amplifier becomes lower than another predetermined temperature, that is lower than the predetermined temperature, during a period in which the voice data are being transmitted at the low level of the transmitting speed.

* * * * *